(12) United States Patent
Haga

(10) Patent No.: US 9,331,008 B2
(45) Date of Patent: May 3, 2016

(54) SEMICONDUCTOR DEVICE

(71) Applicant: ROHM CO., LTD., Kyoto (JP)

(72) Inventor: Motoharu Haga, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/036,304

(22) Filed: Sep. 25, 2013

(65) Prior Publication Data

US 2014/0091464 A1  Apr. 3, 2014

(30) Foreign Application Priority Data

Sep. 28, 2012 (JP) .................................. 2012-217584

(51) Int. Cl.
*H01L 23/498* (2006.01)
*H01L 23/00* (2006.01)

(52) U.S. Cl.
CPC .......... *H01L 23/49827* (2013.01); *H01L 24/05* (2013.01); *H01L 24/48* (2013.01); *H01L 2224/04042* (2013.01); *H01L 2224/45015* (2013.01); *H01L 2224/45144* (2013.01); *H01L 2224/45147* (2013.01); *H01L 2224/48463* (2013.01); *H01L 2224/48824* (2013.01); *H01L 2224/85205* (2013.01)

(58) Field of Classification Search
CPC .. H01L 23/48; H01L 23/485; H01L 23/49827
See application file for complete search history.

(56) References Cited

U.S. PATENT DOCUMENTS

| 6,489,689 | B2 * | 12/2002 | Nojiri ........................... 257/786 |
| 6,507,112 | B1 | 1/2003 | Kurihara et al. |
| 6,858,885 | B2 * | 2/2005 | Ebara ............................. 257/173 |
| 7,102,223 | B1 * | 9/2006 | Kanaoka et al. .............. 257/700 |
| 7,705,462 | B2 * | 4/2010 | Uchikoshi et al. ............. 257/758 |
| 2002/0005583 | A1 * | 1/2002 | Harada et al. .................. 257/758 |
| 2002/0027289 | A1 | 3/2002 | Kurihara et al. |
| 2003/0230809 | A1 * | 12/2003 | Nakajima et al. ............. 257/758 |
| 2005/0093176 | A1 * | 5/2005 | Hung et al. ................... 257/786 |
| 2010/0007024 | A1 * | 1/2010 | Uchikoshi et al. ............. 257/758 |
| 2010/0261344 | A1 * | 10/2010 | Gasner et al. ................. 438/612 |
| 2012/0153444 | A1 * | 6/2012 | Haga et al. .................... 257/666 |

FOREIGN PATENT DOCUMENTS

JP  2000-208441 A  7/2000
JP  2002-076051 A  3/2002

* cited by examiner

*Primary Examiner* — Peniel M Gumedzoe
(74) *Attorney, Agent, or Firm* — Rabin & Berdo, P.C.

(57) ABSTRACT

The semiconductor device of the present invention includes a semiconductor substrate provided with semiconductor elements, a lower layer wiring pattern which includes first wiring and second wiring, the first wiring and the second wiring disposed separately so as to be flush with each other, and the first wiring and the second wiring being fixed at a mutually different potential, an uppermost interlayer film disposed on the lower layer wiring pattern, a titanium nitride layer disposed on the uppermost interlayer film so as to cover the first wiring and the second wiring, and the titanium nitride having the thickness of 800 Å or more, and a pad metal disposed on the titanium nitride layer.

18 Claims, 9 Drawing Sheets

SEMICONDUCTOR DEVICE

TECHNICAL FIELD

The present invention relates to a semiconductor device.

BACKGROUND ART

Conventionally, a semiconductor device in which a bonding pad is disposed directly over semiconductor elements is known. For example, Patent Document 1 has disclosed a semiconductor device which has a substrate, semiconductor elements formed on the semiconductor substrate, a base layer of an Al-based material, a barrier layer and a joining layer on which a bonding wire of an Au-based material is thermally pressed. The base layer, the barrier layer and the joining layer are laminated in this order.

SUMMARY OF INVENTION

In a conventional semiconductor device, as a technique for effectively using a wiring space connected to semiconductor elements, it is conceivable that a region directly under a bonding pad is utilized. At this region, a plurality of wiring, each of which is fixed at a mutually different potential, may be disposed so as to be flush with each other.

However, depending on the intensity of ultrasonic waves on joining a wire to the bonding pad, a crack may appear in the vicinity of the bonding pad and arrives at wiring directly under the bonding pad. As a result, the crack will cause a short circuit, which poses a problem.

An object of the present invention is to provide a semiconductor device which is capable of preventing cracks from occurring directly under a pad metal to improve the reliability.

DESCRIPTION OF EMBODIMENTS

Figure 1:
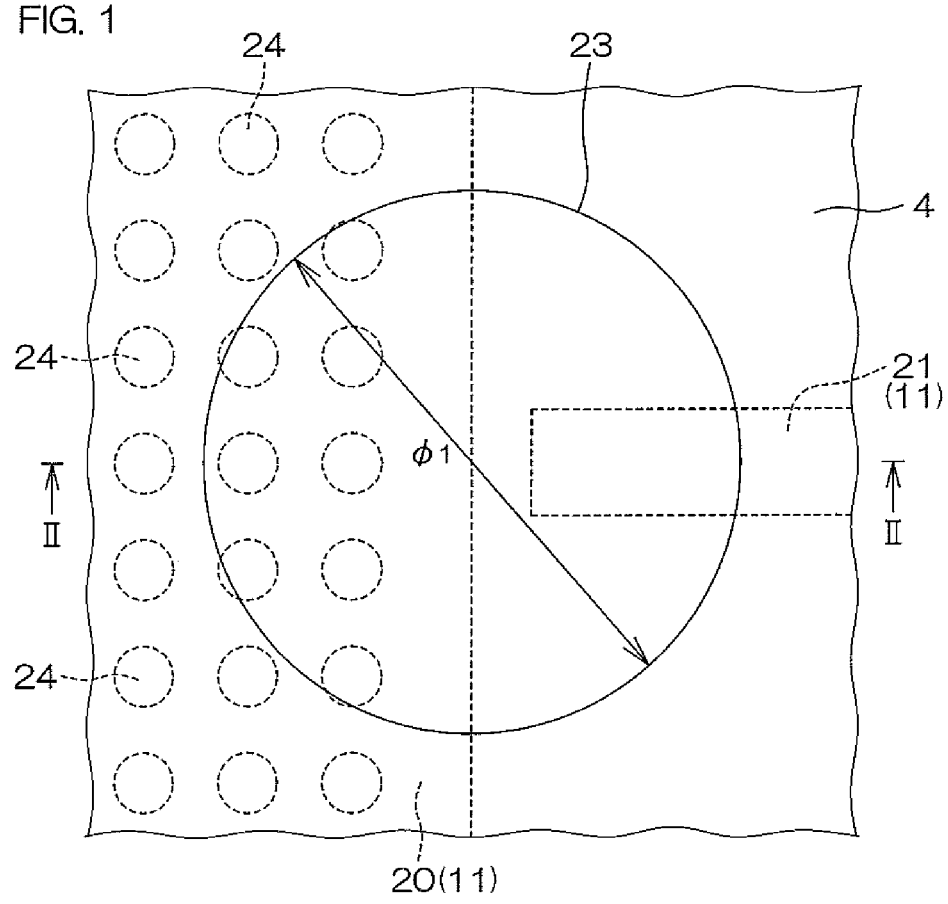
FIG. 1 is a schematic plan view which shows a semiconductor device according to a embodiment of the present invention.

A semiconductor device of the present invention includes a semiconductor substrate provided with semiconductor elements, a lower layer wiring pattern which includes first wiring and second wiring, the first wiring and second wiring disposed separately so as to be flush with each other and the first wiring and the second wiring being fixed at a mutually different potential, an uppermost interlayer film disposed on the lower layer wiring pattern, a titanium nitride layer disposed on the uppermost interlayer film so as to cover the first wiring and the second wiring, the titanium nitride layer having the thickness of 800 Å or more, and a pad metal disposed on the titanium nitride layer.

According to this arrangement, the titanium nitride layer having the thickness of 800 Å or more is disposed between the pad metal and the lower layer wiring pattern. Therefore, ultrasonic waves are applied so as to join a wire to the pad metal, making it possible to prevent cracks from occurring directly under the pad metal. As a result, it is possible to prevent the occurrence of a short circuit and improve the reliability.

"Fixed at a mutually different potential" described above does not mean that the first wiring and the second wiring are individually fixed at a predetermined potential. This phrase means that the first wiring and the second wiring are insulated from each other to provide a relationship that a potential of the first wiring and a potential of the second wiring are not associated with each other.

It is acceptable that the lower layer wiring pattern includes a multilayer wiring structure in which a plurality of wiring layers are laminated via an interlayer film and the first wiring and the second wiring are disposed on the uppermost wiring layer.

Even when the first wiring and the second wiring are disposed on the uppermost wiring layer which is closest to the pad metal among the wiring layers, it is possible to prevent cracks from occurring.

It is acceptable that the semiconductor device includes vias formed so as to penetrate through the uppermost interlayer film and connect the titanium nitride layer with the first wiring, the first wiring is electrically connected to the pad metal via the vias, and the second wiring is insulated from the pad metal.

According to this arrangement, the vias are selectively distributed between the pad metal and the first wiring and a region directly under the pad metal (base layer) is not uniform in material. Therefore, on joining a bonding wire, cracks easily occur disproportionately, for example, at a region directly over the second wiring where no via is formed. However, according to the arrangement of the present invention, it is possible to prevent cracks from occurring under these circumstances.

It is also acceptable that the pad metal includes a wire joining region to which the bonding wire is joined, and the first wiring and the second wiring face the wire joining region in a mutually different planar shape.

The pad metal may be made of aluminum. The first wiring and the second wiring may also be made of aluminum. Further, the uppermost interlayer film may be made of silicon oxide.

Still further, it is preferable that the semiconductor device also includes a copper bonding wire joined to the pad metal, the copper bonding wire having a ball size of 70 μm to 80 μm.

According to the arrangement of the present invention, it is possible to effectively prevent cracks from occurring directly under the pad metal. Therefore, in place of a conventional gold bonding wire, it is possible to use a copper bonding wire which is harder than gold. Then, use of the copper bonding wire high in electric conductivity allows to efficiently conduct electricity to the bonding wire.

Hereinafter, a detailed description will be given of a embodiment of the present invention by referring to the attached drawings.

Figure 2:
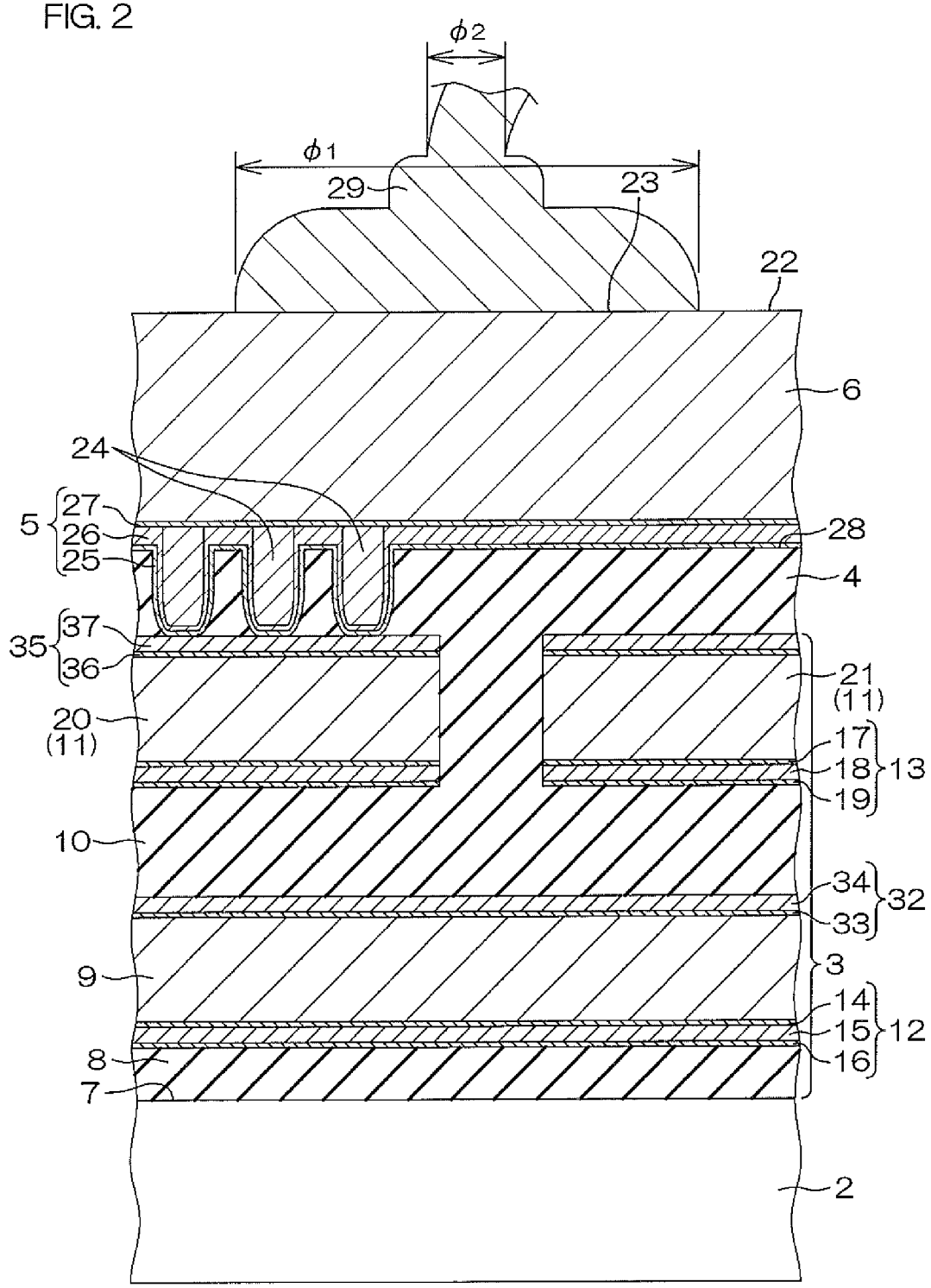
FIG. 2 is a sectional view taken along line II-II in FIG. 1.

FIG. 1 is a schematic plan view which shows a semiconductor device 1 according to a embodiment of the present invention. FIG. 2 is a sectional view taken along line II-II in FIG. 1.

The semiconductor device 1 includes a semiconductor substrate 2, a lower layer wiring pattern 3, an uppermost interlayer film 4, an uppermost barrier film 5, and a pad metal 6.

The semiconductor substrate 2 is composed of a silicon substrate having a surface 7. On the surface 7, for example, semiconductor elements such as a diode, a transistor, a resistor and a capacitor are formed.

The lower layer wiring pattern 3 includes a multilayer wiring structure in which a plurality of wiring layers (metal layers) are laminated sequentially from the surface 7 of the semiconductor substrate 2 via an interlayer film. In this embodiment, the lower layer wiring pattern 3 includes a first metal layer 9 which is laminated on the surface 7 of the semiconductor substrate 2 via a first interlayer film 8 and a second metal layer 11 which is laminated on the first metal layer 9 via a second interlayer film 10. In this embodiment, the second metal layer 11 is shown as an example of the uppermost wiring layer of the present invention.

The first interlayer film 8 and the second interlayer film 10 are made of an insulation material such as silicon oxide ($SiO_2$), for example. Further, the first metal layer 9 and the second metal layer 11 are made of aluminum. In addition, the "aluminum" used in the wiring of this embodiment includes pure aluminum which contains 100% of Al and aluminum alloys made up of Al and other metals such as Al—Cu alloy, Al—Si alloy and Al—Si—Cu alloy (the same shall apply hereinafter).

A first barrier film 12 is formed between the first metal layer 9 and the interlayer film 8. The first barrier film 12 is for preventing impurities (such as Cu and others contained in an alloy) from diffusing into the interlayer film 8. The first barrier film 12 is provided with a three-layer structure (Ti/TiN/Ti) in which, for example, titanium nitride (TiN) is held between titanium (Ti) from both sides. Regarding the thickness of each layer, an inner Ti layer 14 which is in contact with the first metal layer 9 is, for example, from 135 Å to 165 Å in thickness, a TiN layer 15 is from 990 Å to 1210 Å in thickness and an outer Ti layer 16 is from 540 Å to 660 Å in thickness. Further, the first metal layer 9 is, for example, from 3600 Å to 4400 Å in thickness.

A first barrier film 32 is formed between the first metal layer 9 and the interlayer film 10. The first barrier film 32 is for preventing impurities (such as Cu contained in an alloy) from diffusing into the interlayer film 10. The first barrier film 32 is provided with a two-layer structure (Ti/TiN) in which, for example, titanium (Ti) and titanium nitride (TiN) are laminated from the side of the first metal layer 9. Regarding the thickness of each layer, a Ti layer 33 in contact with the first metal layer 9 is, for example, from 180 Å to 220 Å in thickness and a TiN layer 34 is from 900 Å to 1100 Å in thickness.

A second barrier film 13 is formed between the second metal layer 11 and the interlayer film 10. The second barrier film 13 is for preventing impurities (such as Cu contained in an alloy) from diffusing into the interlayer film 10. The second barrier film 13 is provided with a three-layer structure (Ti/TiN/Ti) in which, for example, titanium nitride (TiN) is held between titanium (Ti) from both sides. Regarding the thickness of each layer, an inner Ti layer 17 in contact with the second metal layer 11 is, for example, from 135 Å to 165 Å in thickness, a TiN layer 18 is from 900 Å to 1100 Å in thickness and an outer Ti layer 19 is from 90 Å to 110 Å in thickness. Further, the second metal layer 11 is, for example, from 3600 Å to 4400 Å in thickness.

A second barrier film 35 is formed between the second metal layer 11 and the uppermost interlayer film 4. The second barrier film 35 is for preventing impurities (such as Cu contained in an alloy) from diffusing into the uppermost interlayer film 4. The second barrier film 35 is provided with a two-layer structure (Ti/TiN) in which, for example, titanium (Ti) and titanium nitride (TiN) are laminated from the side of the second metal layer 9. Regarding the thickness of each layer, a Ti layer 36 which is in contact with the second metal layer 11 is, for example, from 180 Å to 220 Å in thickness and a TiN layer 37 is from 900 Å to 1100 Å in thickness.

The second metal layer 11 includes first wiring 20 and second wiring 21 which are disposed separately from each other. That is, each of the first wiring 20 and the second wiring 21 forms a part of a common wiring layer (flush with each other) which is the second metal layer 11. In this embodiment, each of the first wiring 20 and the second wiring 21 arranges a mutually different circuit and is fixed at a mutually different potential.

Further, the first wiring 20 and the second wiring 21 face an annular wire joining region 23 in a mutually different shape when a surface 22 of the pad metal 6 is viewed from above. For example, in FIG. 1, the first wiring 20 is formed in a planar shape facing the wire joining region 23 at a relatively large area. On the other hand, the second wiring 21 is formed in a linear shape facing the wire joining region 23 at a smaller area than the first wiring 20. Therefore, a part of the uppermost interlayer film 4 selectively enters into the second wiring 21 laterally in a width direction (on both sides in FIG. 1) at an inner region of the wire joining region 23, and the uppermost interlayer film 4 faces the wire joining region 23 so as to be flush with the first wiring 20 and the second wiring 21.

The uppermost interlayer film 4 is made of an insulation material such as silicon oxide ($SiO_2$). A plurality of vias 24 are buried into the uppermost interlayer film 4 and penetrate through the uppermost interlayer film 4 in the thickness direction and are electrically connected to the first wiring 20. The plurality of vias 24 are arrayed, for example, on the first wiring 20 in a matrix form. Each of the vias 24 is made of tungsten (W), for example. Further, the uppermost interlayer film 4 is, for example, from 10800 Å to 13200 Å in thickness.

The uppermost barrier film 5 includes a lower Ti layer 25, a TiN layer 26 as an example of the titanium nitride layer of the present invention, and an upper Ti layer 27.

The lower Ti layer 25 and the TiN layer 26 are installed between the vias 24 and the uppermost interlayer film 4. More specifically, the lower Ti layer 25 is disposed so as to be in contact with the uppermost interlayer film 4. The lower Ti layer 25 is in contact with the uppermost interlayer film 4 on the sides and in contact with the TiN layer 37 of the second barrier film 35 at the bottom. Further, the TiN layer 26 is disposed between the lower Ti layer 25 and the vias 24. Then, the vias 24 are buried into the TiN layer 26. Further, the lower Ti layer 25 and the TiN layer 26 are disposed along a surface 28 of the uppermost interlayer film 4 and also straddle the first wiring 20 and the second wiring 21. Thereby, the lower Ti layer 25 and the TiN layer 26 cover the first wiring 20 and the second wiring 21 at the wire joining region 23. The lower Ti layer 25 is, for example, from 90 Å to 110 Å in thickness, and the TiN layer 26 is 800 Å or more in thickness, preferably 1200 Å or more, and more preferably from 1200 Å to 1600 Å.

The upper Ti layer 27 is installed between the TiN layer 26 and the pad metal 6 so as to cover upper faces of the vias 24. The upper Ti layer 27 is, for example, from 135 Å to 165 Å in thickness.

The pad metal 6 is made of aluminum and, for example, from 25200 Å to 30800 Å in thickness. A bonding wire 29 is joined to the surface 22 of the pad metal 6.

The bonding wire 29 is made of, for example, high-purity copper with a purity of 99.9999% (6N) or more or with a purity of 99.99% (4N) or more (it may contain a trace amount of impurities). The bonding wire 29 is joined to the pad metal 6 by application of ultrasonic waves at 90 mA to 120 mA, for example. The wire joining region 23 is a region which is joined to the pad metal 6 of the bonding wire 29 after application of ultrasonic waves. In this embodiment, the wire joining region 23 is, for example, from 70 μm to 80 μm in size $\Phi_1$ (the ball size of the bonding wire 29). Further, the bonding wire 29 is, for example, from 30 μm to 35 μm in wire diameter $\Phi_2$.

Next, a description will be given of steps which cover formation of the pad metal 6 after formation of the second metal layer 11.

FIG. 3A to FIG. 3E are sectional views which explain sequentially steps for forming the pad metal 6.

Figure 3A:
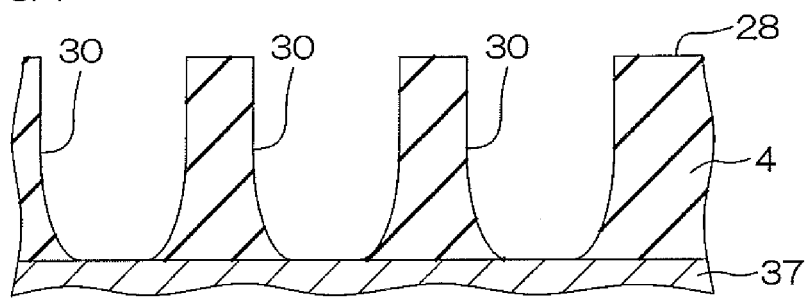
FIG. 3A is a sectional view which explains a step related to formation of a pad metal.

First, as shown in FIG. 3A, for example, CVD (chemical vapor deposition) method is used to laminate the uppermost interlayer film 4 on the second metal layer 11 (second barrier film 35). Next, the uppermost interlayer film 4 is subjected to selective etching to form a plurality of via holes 30 which selectively expose the first wiring 20 (not illustrated).

Figure 3B:
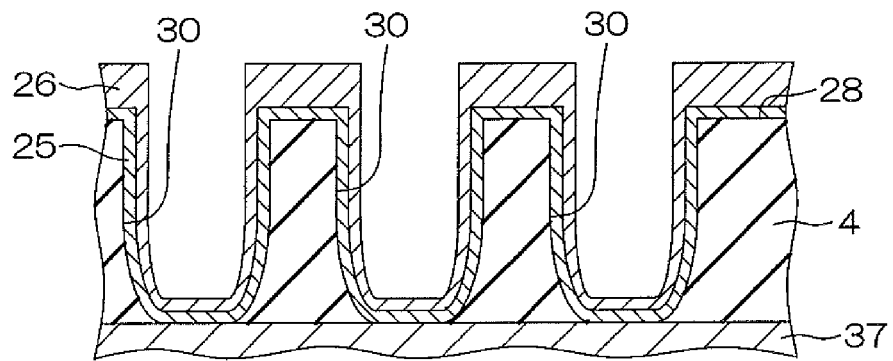
FIG. 3B is a drawing which shows a step subsequent to that of FIG. 3A.

Next, as shown in FIG. 3B, a titanium material and a titanium nitride material are deposited on inner faces of the via holes 30 and the surface 28 of the uppermost interlayer film 4, for example, by sputtering. Thereby, the lower Ti layer 25 and the TiN layer 26 are formed.

Figure 3C:
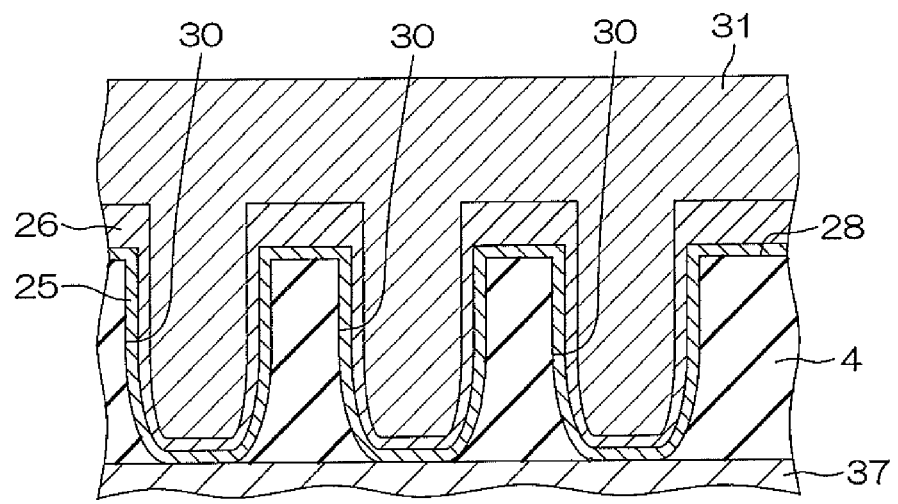
FIG. 3C is a drawing which shows a step subsequent to that of FIG. 3B.

Next, as shown in FIG. 3C, a tungsten material 31 is deposited on the surface 28 of the uppermost interlayer film 4, for example, by CVD method. This deposition continues until the via holes 30 are filled with the tungsten material 31 to cover the surface 28 of the uppermost interlayer film 4.

Figure 3D:
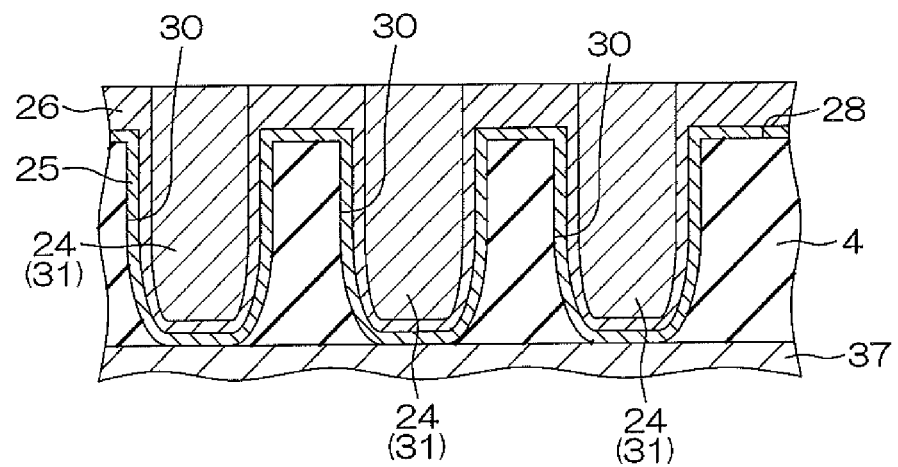
FIG. 3D is a drawing which shows a step subsequent to that of FIG. 3C.

Next, as shown in FIG. 3D, the tungsten material 31 is polished, for example, by etch back until an etch back face becomes flush with the TiN layer 26, thus resulting in formation of vias 24 which are buried into the via holes 30 (inside the lower Ti layer 25 and the TiN layer 26).

Figure 3E:
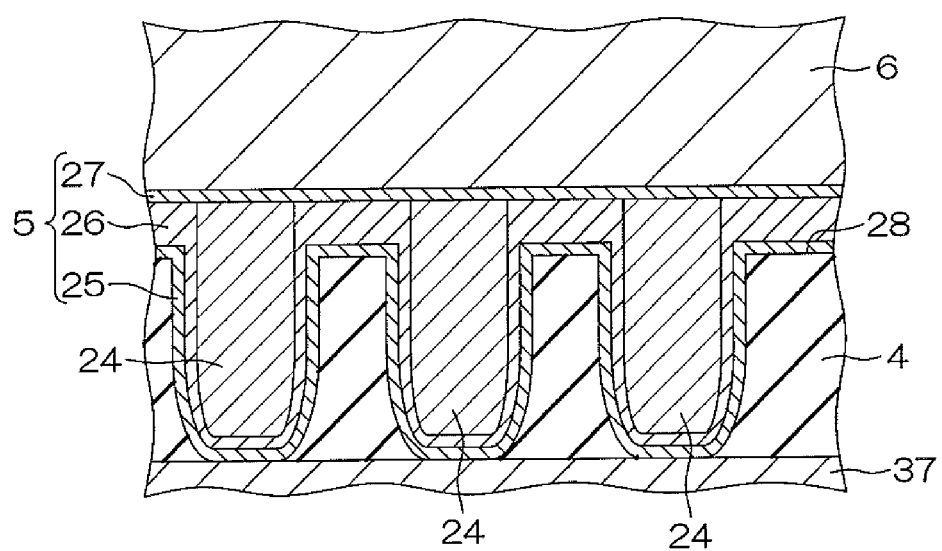
FIG. 3E is a drawing which shows a step subsequent to that of FIG. 3D.

Next, as shown in FIG. 3E, the upper Ti layer 27 and the pad metal 6 are sequentially laminated, for example, by sputtering method. Thereafter, the pad metal 6 is subjected to patterning, for example, by RIE (reactive ion etching).

The semiconductor device 1 shown in FIG. 1 and FIG. 2 is provided by way of the steps so far described.

According to the semiconductor device 1, although the first wiring 20 faces the wire joining region 23 in a planar shape, the second wiring 21 faces the wire joining region 23 in a linear shape. Therefore, a part of the uppermost interlayer film 4 selectively enters into the second wiring 21 on both sides in the width direction at an inner region of the wire joining region 23, and the uppermost interlayer film 4 faces the wire joining region 23 so as to be flush with the first wiring 20 and the second wiring 21. Further, the plurality of vias 24 are arrayed on the first wiring 20. However, via 24 is not arrayed on the second wiring 21.

Therefore, aluminum regions corresponding to the first wiring 20 and the second wiring 21 as well as a plurality of regions of the silicon oxide region corresponding to the uppermost interlayer film 4 are distributed irregularly at a region (base layer) directly under the wire joining region 23. Thereby, the region is made of non-uniform in material. As a result, where ultrasonic waves are applied to the bonding wire 29, a crack will easily occur below from the pad metal 6 disproportionately at a region directly over the second wiring 21 at which silicon oxide is harder and more fragile than aluminum prevails.

However, according to the semiconductor device 1, the TiN layer 26 having the thickness of 800 Å or more is disposed between the pad metal 6 and the lower layer wiring pattern 3. Therefore, ultrasonic waves are applied to join a wire to the pad metal 6, making it possible to prevent cracks from occurring directly under the pad metal 6. As a result, it is possible to prevent the occurrence of a short circuit and also improve the reliability.

As a result, a conventional gold bonding wire (gold or an alloy of gold, etc.) can be replaced by a copper bonding wire which is harder than the gold bonding wire. Then, use of the copper bonding wire high in electric conductivity allows to efficiently conduct electricity to the bonding wire 29.

A description has been so far given of the embodiment of the present invention. The present invention can also be carried out by other modes.

For example, the bonding wire 29 may be a gold bonding wire.

Further, the previous embodiment was described by referring to a case where the lower layer wiring pattern 3 was provided with a two-layer structure. It is also acceptable that the lower layer wiring pattern 3 is provided with a single structure, a three-layer structure, a four-layer structure and a multilayer structure more than the four-layer structure.

The present invention can be modified for its design in various ways within the scope of the attached claims.

The embodiment of the present invention is used only as a specific example for clarifying technical contents of the present invention, to which the present invention shall not be construed so as to be restricted in any way, and the spirit and scope of the present invention shall be limited only by the accompanying claims.

The present application corresponds to Japanese Patent Application No. 2012-217584 filed on Sep. 28, 2012 with the Japan Patent Office, and the entire disclosures of the application shall be incorporated herein by citation.

EXAMPLES

Next, the effects of the present invention on prevention of occurrence of a crack were confirmed by referring to an example. In addition, the present invention shall not be limited by the following example in any way.

Six types of the semiconductor devices 1 with the structure shown in FIG. 1 and FIG. 2 were prepared by changing only the thickness of the TiN layer 26 of the uppermost barrier film 5 (semiconductor devices No. 1 to 6). In the semiconductor devices No. 1 to 6, the lower Ti layer 25 was 150 Å in thickness, the upper Ti layer 27 was 100 Å in thickness and the pad metal 6 (TOP) was 28000 Å in thickness.

Next, six types of ultrasonic waves were applied to join the copper bonding wire 29 having the wire diameter $\Phi_2$=35 μm to the pad metal 6 of each of the semiconductor devices No. 1 to 6. These six types of ultrasonic waves were 90 mA, 100 mA, 105 mA, 110 mA and 120 mA. Then, after the copper bonding wire 29 was joined, an investigation was made for whether or not cracks along patterns of the first wiring 20 and the second wiring 21 (pattern crack) occurred directly under the pad metal 6 of each of the semiconductor devices No. 1 to 6. An investigation was also made for a percentage of the cracks if they occurred. The results are shown in Table 1 as well as in FIG. 4 and FIG. 5.

Figure 4:
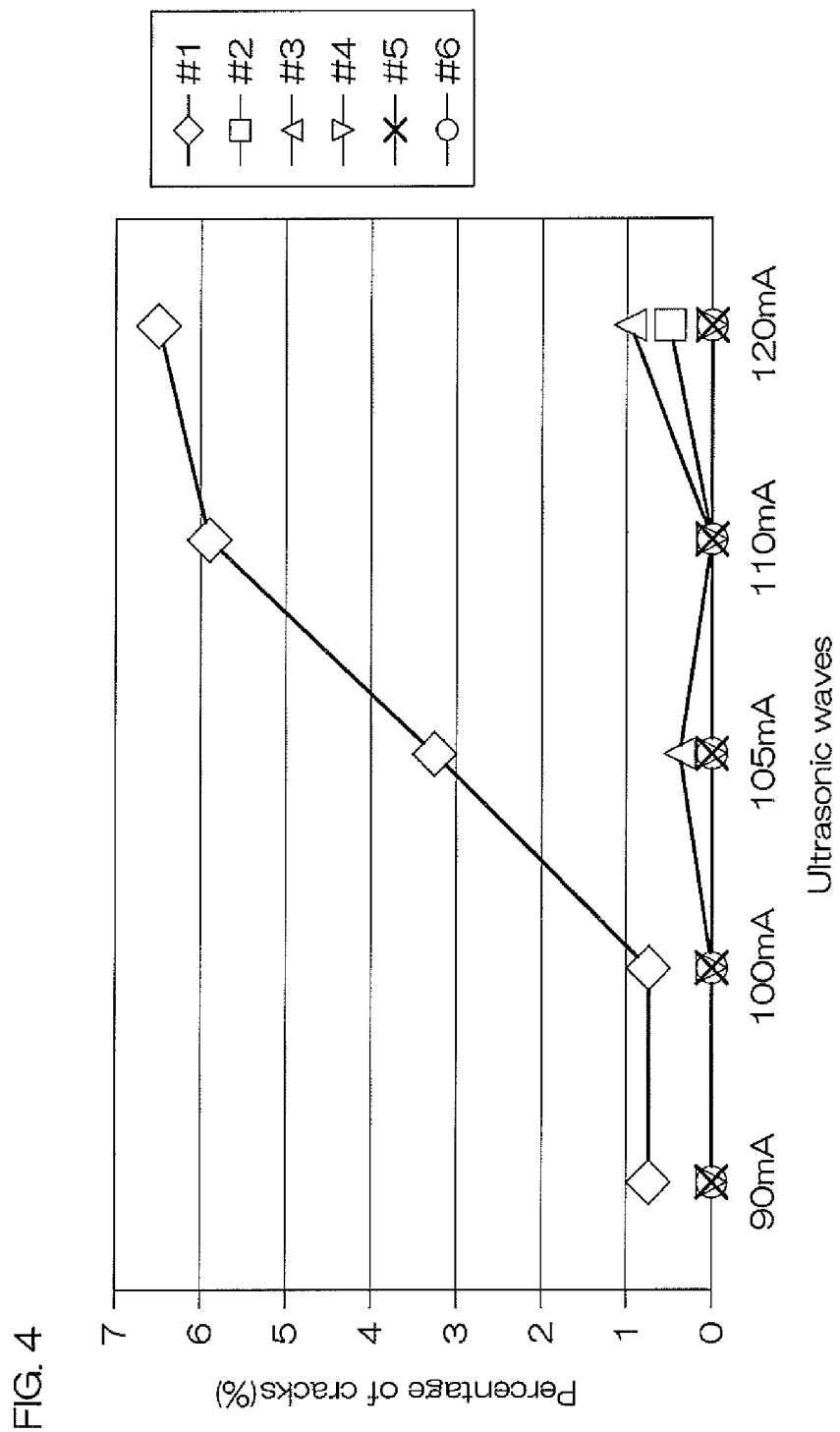
FIG. 4 is a graph which shows a relationship between ultrasonic waves and a crack percentage.
Figure 5:
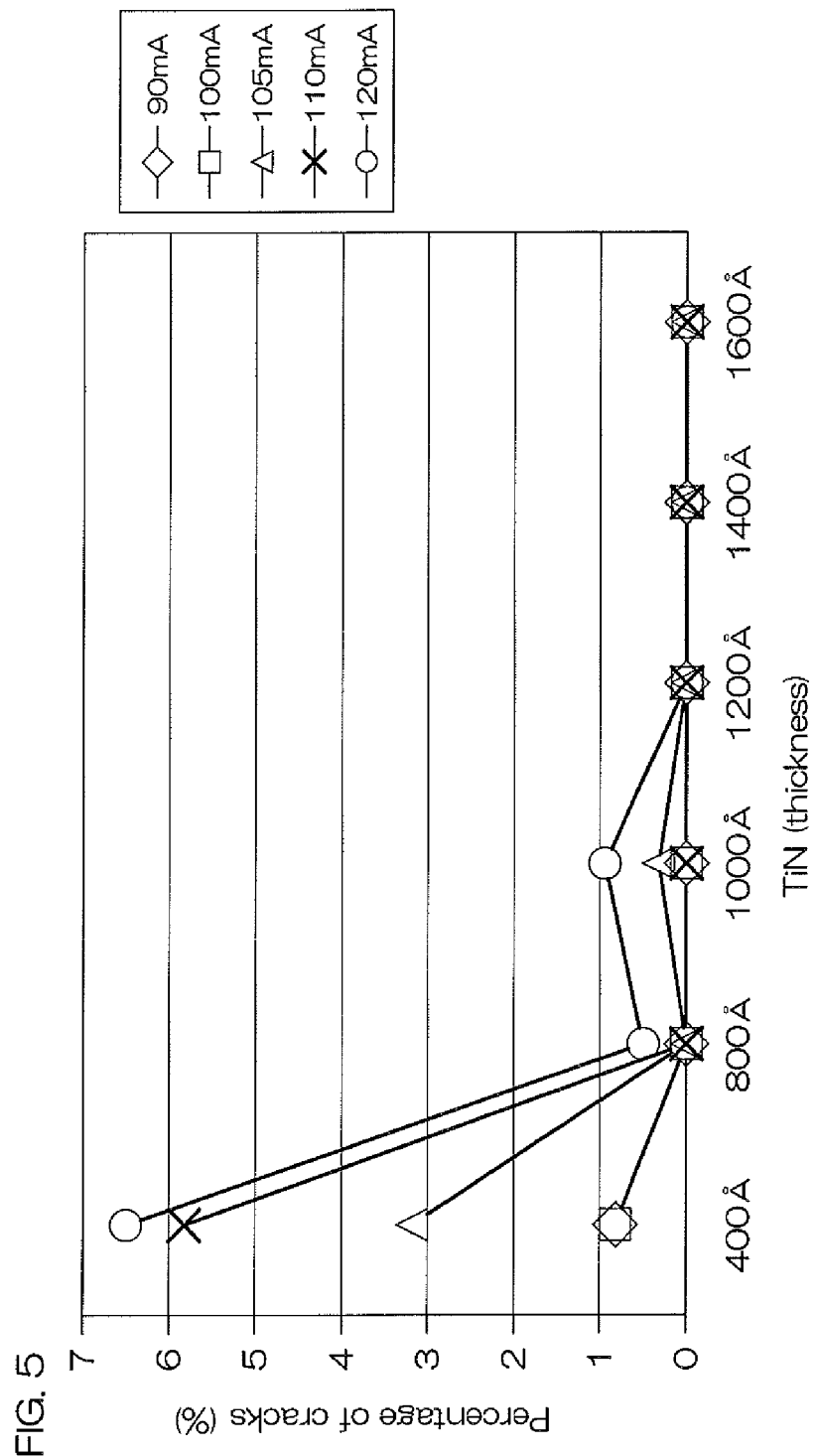
FIG. 5 is a graph which shows a relationship between a TiN layer and a crack percentage.

As apparent from Table 1, FIG. 4 and FIG. 5, the pattern crack was prevented from occurring in the semiconductor devices No. 2 to 6 in which the respective TiN layers 26 were 800 Å, 1000 Å, 1200 Å, 1400 Å and 1600 Å in thickness (0.00%). Among other things, in the semiconductor devices No. 4 to 6 in which the respective TiN layers 26 were 1200 Å, 1400 Å and 1600 Å in thickness, it was found that no pattern crack occurred irrespective of the intensity of ultrasonic waves (0.00%).

On the other hand, in the semiconductor device No. 1 having the TiN layer 26 of 400 Å in thickness, it was found that the pattern crack occurred irrespective of the intensity of the ultrasonic waves (≠0.00%).

TABLE 1

| Re-sults | TOP 28,000 Å Ti/TiN/Ti | Ultrasonic waves | | | | |
|---|---|---|---|---|---|---|
| | | 90 mA | 100 mA | 105 mA | 110 mA | 120 mA |
| x | No. 1 (150/400/100 Å) | 0.74% | 0.74% | 3.31% | 5.88% | 6.54% |
| Δ | No. 2 (150/800/100 Å) | 0.00% | 0.00% | 0.00% | 0.00% | 0.57% |
| Δ | No. 3 (150/1000/100 Å) | 0.00% | 0.00% | 0.37% | 0.00% | 0.92% |
| ○ | No. 4 (150/1200/100 Å) | 0.00% | 0.00% | 0.00% | 0.00% | 0.00% |
| ○ | No. 5 (150/1400/100 Å) | 0.00% | 0.00% | 0.00% | 0.00% | 0.00% |
| ○ | No. 6 (150/1600/100 Å) | 0.00% | 0.00% | 0.00% | 0.00% | 0.00% |

Figure 6:
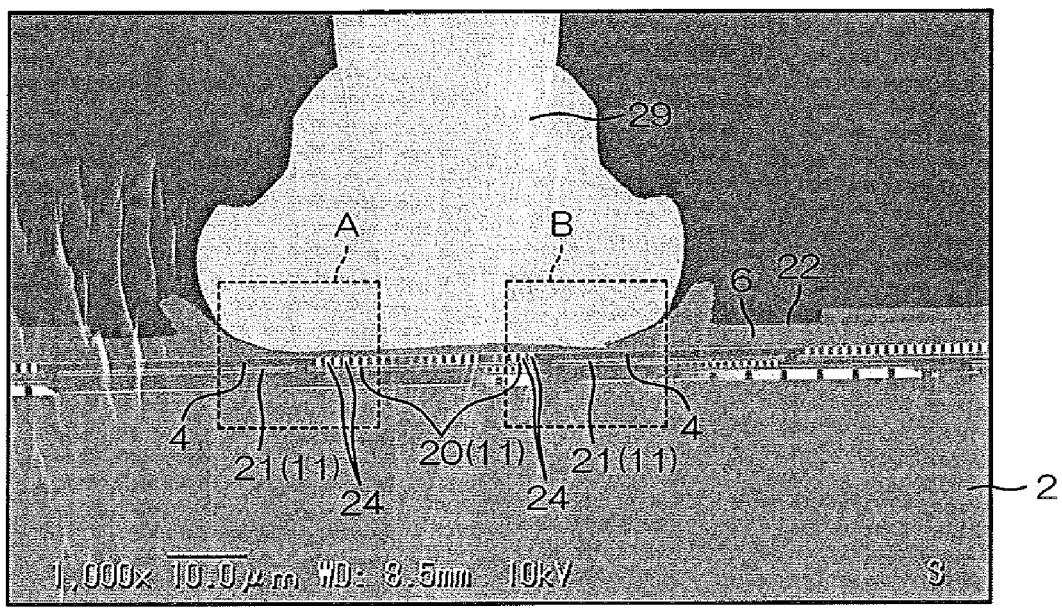
FIG. 6 is a SEM image which covers a portion at which a bonding wire is joined to a pad metal and the peripheries thereof.
Figure 7:
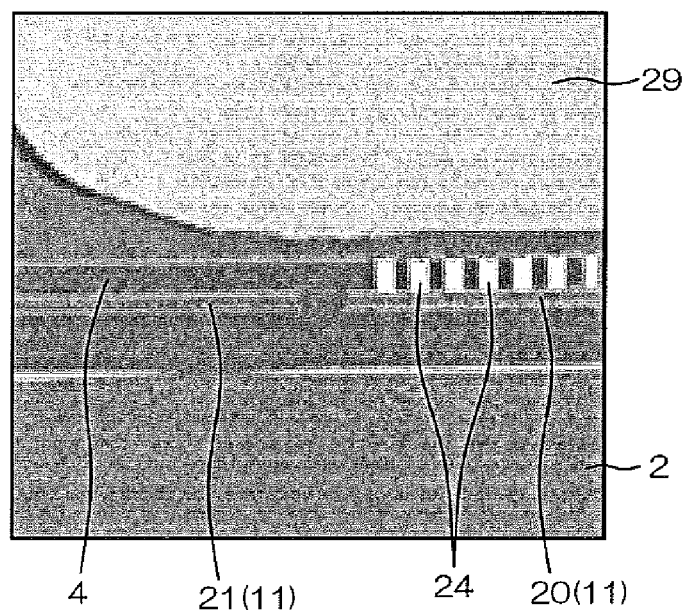
FIG. 7 is an enlarged photo which shows a portion enclosed with a broken line A in FIG. 6.
Figure 8:
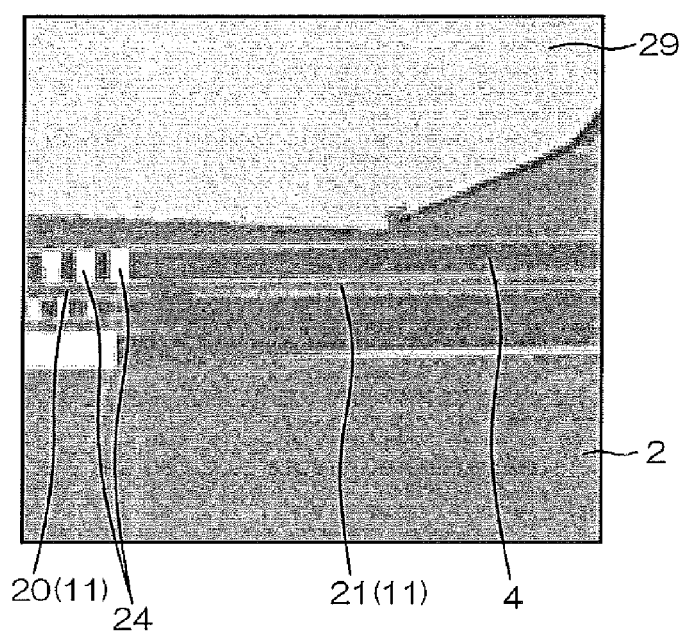
FIG. 8 is an enlarged photo which shows a portion enclosed with a broken line B in FIG. 7.

Semiconductor devices identical in structure with the semiconductor device 1 shown in FIG. 1 and FIG. 2 were prepared to take SEM images which cover a bonding wire and peripheries thereof. The thus obtained images are shown in FIG. 6 to FIG. 8.

The invention claimed is:

1. A semiconductor device comprising:
   a semiconductor substrate upon which semiconductor elements are formed;
   a lower layer wiring pattern which includes a multilayer wiring structure including a plurality of wiring layers and an interlayer film, in the multilayer wiring structure, the plurality of wiring layers being laminated via the interlayer film, an uppermost wiring layer of the plurality of wiring layers including a first wiring and a second wiring, the first wiring and the second wiring disposed separately so as to be flush with each other and the first wiring is fixed at a different potential from that of the second wiring;
   an uppermost interlayer film disposed on the lower layer wiring pattern;
   a titanium nitride layer disposed on the uppermost interlayer film to be flat, the titanium nitride layer covering the first wiring and the second wiring, the titanium nitride layer having a thickness of 800 Å or more;
   a pad metal disposed on the titanium nitride layer, the second wiring being insulated from the pad metal; and
   vias formed so as to penetrate through the uppermost interlayer film to connect a portion of the titanium nitride layer with the first wiring at a region facing the pad metal in a vertical direction, the first wiring being electrically connected to the pad metal through the vias, wherein the vias are arranged at regular intervals in a first direction and a second direction,
   the pad metal includes a wire joining region to which a bonding wire is joined, and
   in a plan view, the vias are arranged in only a part of an entire region directly beneath the wire joining region.

2. The semiconductor device according to claim 1, wherein the first wiring and the second wiring face the wire joining region, and
   a first region of the first wiring directly beneath the wire joining region has a different planar shape from that of a second region of the second wiring directly beneath the wire joining region.

3. The semiconductor device according to claim 1, wherein the pad metal is made of aluminum.

4. The semiconductor device according to claim 1, wherein the first wiring and the second wiring are made of aluminum.

5. The semiconductor device according to claim 1, wherein the uppermost interlayer film is made of silicon oxide.

6. The semiconductor device according to claim 1 further comprising a copper bonding wire joined to the pad metal, and the copper bonding wire having a ball size of 70 μm to 80 μm.

7. The semiconductor device according to claim 1, wherein an entire surface of the titanium nitride layer is flat.

8. The semiconductor device according to claim 1, wherein the titanium nitride layer has a distal surface which is further away from the first and second wiring than any other surface of the titanium nitride layer, the entire distal surface being flat.

9. The semiconductor device according to claim 1, wherein an uppermost surface of the titanium nitride layer is completely flat.

10. The semiconductor device according to claim 1, wherein the vias are intensively arranged in the part of the entire region directly beneath the wire joining region.

11. The semiconductor device according to claim 1, wherein the vias are more intensively arranged in an entire region above the first wiring than an entire region above the second wiring.

12. The semiconductor device according to claim 1, wherein the first direction is perpendicular to the second direction in a plan view.

13. The semiconductor device according to claim 1, wherein in the plan view, the part of the entire region is above the first wiring.

14. A semiconductor device comprising:
   a semiconductor substrate upon which semiconductor elements are formed;
   a lower layer wiring pattern which includes a multilayer wiring structure including a plurality of wiring layers and an interlayer film, in the multilayer wiring structure, the plurality of wiring layers being laminated via the interlayer film, an uppermost wiring layer of the plurality of wiring layers including a first wiring and a second wiring, the first wiring and the second wiring disposed separately so as to be flush with each other and the first wiring is fixed at a different potential from that of the second wiring;
   an uppermost interlayer film disposed on the lower layer wiring pattern;
   a titanium nitride layer disposed on the uppermost interlayer film to be flat, the titanium nitride layer covering the first wiring and the second wiring, the titanium nitride layer having a thickness of 800 Å or more;
   a pad metal disposed on the titanium nitride layer, the pad metal including a wire joining region in which a bonding wire is joined to the pad metal, the first wiring and the second wiring facing the wire joining region, all of an entire region of the first wiring directly beneath the wiring joining region has a greater total area than that of all of an entire region of the second wiring directly beneath the wiring joining region, the second wiring being insulated from the pad metal; and vias formed so as to penetrate through the uppermost interlayer film and connect a portion of the titanium nitride layer with the region of the first wiring, the first wiring being electrically connected to the pad metal through the vias, the vias are arranged at regular intervals in a first direction and a second direction, and in a plan view, the vias are arranged in only a part of an entire region directly beneath the wire joining region.

15. The semiconductor device according to claim 14, wherein the vias are intensively arranged in the part of the entire region directly beneath the wire joining region.

16. The semiconductor device according to claim 14, wherein the vias are more intensively arranged above the entire region of the first wiring than above the entire region of the second wiring.

17. The semiconductor device according to claim 14, wherein the first direction is perpendicular to the second direction in a plan view.

18. The semiconductor device according to claim 14, wherein in the plan view, the part of the entire region is above the first wiring.

* * * * *